United States Patent
Nakahara

(10) Patent No.: US 7,576,964 B2
(45) Date of Patent: Aug. 18, 2009

(54) OVERVOLTAGE PROTECTION CIRCUIT OF OUTPUT MOS TRANSISTOR

(75) Inventor: Akihiro Nakahara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 75 days.

(21) Appl. No.: 10/948,192

(22) Filed: Sep. 24, 2004

(65) Prior Publication Data

US 2005/0068705 A1  Mar. 31, 2005

(30) Foreign Application Priority Data

Sep. 30, 2003  (JP) ............................. 2003-340848

(51) Int. Cl.
- H02H 3/20 (2006.01)
- H02H 9/04 (2006.01)
- H02H 9/00 (2006.01)
- H02H 3/22 (2006.01)
- H01C 7/12 (2006.01)
- H02H 1/00 (2006.01)
- H02H 1/04 (2006.01)
- H02H 9/06 (2006.01)

(52) U.S. Cl. .................. 361/91.1; 361/56; 361/111; 361/118

(58) Field of Classification Search .................. None
See application file for complete search history.

(56) References Cited

U.S. PATENT DOCUMENTS

| | | | |
|---|---|---|---|
| 4,879,254 A * | 11/1989 | Tsuzuki et al. | ............. 438/273 |
| 5,028,811 A * | 7/1991 | Le Roux et al. | ............. 327/110 |
| 5,838,526 A | 11/1998 | Ishikawa et al. | |
| 6,087,877 A * | 7/2000 | Gonda et al. | ................. 327/309 |
| 6,388,494 B1 * | 5/2002 | Kindt et al. | ................... 327/307 |
| 6,538,855 B1 * | 3/2003 | Nakamura et al. | .......... 360/318 |
| 7,129,759 B2 * | 10/2006 | Fukami | ....................... 327/110 |
| 7,310,006 B2 * | 12/2007 | Shimada | ..................... 326/83 |

FOREIGN PATENT DOCUMENTS

| | | |
|---|---|---|
| JP | 6-204410 | 7/1994 |
| JP | 6-252721 | 9/1994 |
| JP | 8-008704 | 1/1996 |
| JP | 8-288817 | 11/1996 |
| JP | 9-163583 | 6/1997 |
| JP | 9-298834 | 11/1997 |
| JP | 11-032429 | 2/1999 |
| JP | 11-041801 | 2/1999 |
| JP | 2000-245137 A | 9/2000 |
| JP | 2002-151989 A | 5/2002 |
| JP | 2002-343969 | 11/2002 |

* cited by examiner

Primary Examiner—Albert W Paladini
Assistant Examiner—Dharti Patel
(74) Attorney, Agent, or Firm—Foley & Lardner LLP

(57) ABSTRACT

An overvoltage protection circuit is for a circuit of an output MOS transistor and a load connected in series between a first power supply and a second power supply. The overvoltage protection circuit contains a control signal circuit, a dynamic clamping circuit, a control switch, and a serge detecting circuit. The control signal circuit is connected between a gate of said output MOS transistor and said load, and the dynamic clamping circuit is connected with said gate of said output MOS transistor. The control switch is connected between said first power supply and said dynamic clamping circuit and the serge detecting circuit which monitors a voltage of said first power supply and turns on said control switch when the voltage of said first power supply increases to a voltage higher than a predetermined voltage.

9 Claims, 4 Drawing Sheets

OVERVOLTAGE PROTECTION CIRCUIT OF OUTPUT MOS TRANSISTOR

BACKGROUND OF THE INVENTION

1. Field of the Invention

The present invention relates to a semiconductor integrated circuit, and more particularly to an overvoltage protection circuit of an output MOS transistor in a semiconductor integrated circuit.

2. Description of the Related Art

Conventionally, an overvoltage protection circuit is widely used to protect a transistor from an overvoltage such as serge voltage, and a dynamic clamping circuit is known as the overvoltage protection circuit disclosed in Japanese Laid Open Patent Application (JP-A-Heisei 06-204410).

FIG. 1 shows the structure of such a dynamic clamping circuit, which is composed of a resistor 5, a MOS transistor 6, an output MOS transistor 7, a load 9, and a dynamic clamping circuit 10. As shown in FIG. 1, the output MOS transistor 7 and the load 9 are connected in series between a first power supply 1 and a second power supply 2 to form a N-channel source follower circuit structure. A node between the output MOS transistor 7 and the load 9 is connected with an output terminal 8. The output MOS transistor 7 is controlled to an ON/OFF state in response to a first control signal 3 supplied to a node A which is connected with the gate terminal i.e., a node B through a gate resistance 5. The first control signal 3 is an output voltage signal of a boosting circuit (not shown). The first control signal 3 has a signal of a voltage level higher than a voltage of the first power supply 1 when the output MOS transistor 7 is turned on, and has substantially the same voltage as a voltage of the second power supply 2 when the output MOS transistor 7 is turned off.

The MOS transistor 6 is connected between the node A and the output terminal 8 to discharge the gate charge of the output MOS transistor 7 when the output MOS transistor 7 is turned off. The MOS transistor 6 is controlled between the ON/OFF state in response to a second control signal 4 supplied to the gate terminal, i.e., a node C. The second control signal 4 has a substantially the same voltage as a voltage of the first power supply 1 when the MOS transistor 6 is turned on, and has substantially the same voltage as a voltage of the second power supply 2 when the MOS transistor 6 is turned off. When the first control signal 3 is in a high level, the second control signal 4 becomes in a low level. The reversal is true, too. The dynamic clamping circuit 10 is connected between the first power supply 1 and the node B. The dynamic clamping circuit 10 is composed of a zener diode D1 and diode D2 which are connected in series.

Next, the operation of the circuit will be described. When the output MOS transistor 7 should be turned off, the first control signal 3 is set to the low level and the second control signal 4 is set to the high level. At this time, the MOS transistor 6 is turned on such that the gate charge of the output MOS transistor 7 or the charge at the node B is discharged to the second power supply 2 through the output terminal 8 and the load 9. Also, a negative output voltage due to back electromotive force is generated at the output terminal 8 because of an inductance component of the load (inductance component of the inductive load such as a solenoid and a wire harness). In the high side switch for the automobile, a breakdown voltage of output MOS transistor 7 is set to 60 V or higher and a breakdown voltage of the dynamic clamping circuit 10 is set to about 40-60 V which is approximately equal to the breakdown voltage of the zener diode D1. When the applied voltage exceeds a breakdown voltage of the output MOS transistor 7, the output MOS transistor 7 breaks down and a breakdown current flows. Thus, there is a possibility that the output MOS transistor 7 degrades, if the overvoltage protection is not carried out by the dynamic clamping circuit 10. When a voltage higher than the breakdown voltage of the dynamic clamping circuit 10 is applied between the first power supply 1 and the output terminal 8 because of the negative output voltage generated at the output terminal 8, the voltage between the drain and the source in the output MOS transistor 7 is clamped to a breakdown voltage of the dynamic clamping circuit 10. With the negative output voltage, the design of the load is carried out such that the current flowing through the output MOS transistor 7 does not cross over a safe operation area when an overvoltage protection circuit operates. Therefore, there is no case that the output MOS transistor 7 is destroyed.

On the other hand, a positive voltage dump serge is generated at the first power supply 1 when a battery terminal is unfastened during the power generation by an alternator. If the dump serge is applied when the output MOS transistor 7 is in the off state, the dynamic clamping circuit 10 operates such that the dynamic clamping circuit 10 breaks down, like the case of the generation of the negative output voltage. At this time, the gate voltage rises so that the output MOS transistor 7 is turned on. As a result, the current flowing through the output MOS transistor 7 crosses over the safe operation area (SOA). Therefore, the output MOS transistor 7 is destroyed.

By the way, in the above-mentioned high side switch, the turn-on resistance of the output MOS transistor 7 is very small. The output MOS transistor 7 is formed from a set of cells as disclosed in Japanese Laid Open Patent Application (JP-P2002-343969A). As a method of accomplishing a low resistance, a method is used in which a cell size is shrunk to decrease the turn-on resistance per unit area. Through the cell shrinking, a phenomenon appears that the forward SOA is narrowed due to secondary breakdown in a state that a high voltage is applied between the drain and the source in the output MOS transistor 7. This gives a constraint to an overvoltage protection circuit operating in this area. Because the safe operation area becomes narrow, if the overvoltage protection circuit operates when an overvoltage of the dump serge is applied, the operation point crosses over the safe operation area so that the output MOS transistor 7 results in heat destruction. This phenomenon did not cause a problem in case of the output MOS transistor 7 having a wide safe operation area.

In conjunction with the above description, a drive circuit of a semiconductor switch is disclosed in Japanese Laid Open Patent Application (JP-A-Heisei 6-252721). In the drive circuit of this conventional example, a semiconductor switch controls supply of power to a load connected with a load drive power supply. A zener diode sets the semiconductor switch to an ON state based on the rise of a voltage between the semiconductor switch and the load when the semiconductor switch is turned off. A second semiconductor switch is connected in series with the zener diode. A short-circuit detection circuit is provided to turn off a second semiconductor switch based on a voltage between the semiconductor switch and the load because of the short-circuit of the zener diode.

Also, a high side switch circuit is disclosed in Japanese Laid Open Patent Application (JP-A-Heisei 8-8704). In the high side switch circuit of this conventional example, a boosting section supplies a first MOS transistor for a high side switch with a gate voltage obtained by boosting a power supply voltage. A serge detecting section detects a serge voltage higher than the maximum rating power supply voltage. A second MOS transistor is provided between a power supply terminal and the boosting section and is turned off based on the output of the serge detecting section. A resistance is provided between the gate of the second MOS transistor and the power supply terminal. A third MOS transistor is provided between the gate of the second MOS transistor and the ground. A voltage boosted by the boosting section is fed back to the gate of the second MOS transistor through a first diode. The output of the serge detecting section is connected with the gate of the third MOS transistor. When the second MOS transistor is turned off, the third MOS transistor is turned on.

Also, a semiconductor device is disclosed in Japanese Laid Open Patent Application (JP-A-Heisei 8-288817). In this conventional example, the semiconductor device is composed of a power MOSFET which has a drain connected with a power supply terminal and a source connected with an output terminal. A first MOSFET is arranged between the gate of the power MOSFET and the ground of the control circuit to turn off the power MOSFET based on a voltage of an input terminal. A second MOSFET is arranged between the gate of the power MOSFET and an output terminal to turn off the power MOSFET based on the voltage of the input terminal. A gate charging circuit is connected with the gate of the power MOSFET to turn on the power MOSFET based on the voltage of the input terminal.

Also, a protection circuit of a semiconductor device is disclosed in Japanese Laid Open Patent Application (JP-A-Heisei 9-163583). In an inverse bias safe operation area of an IGBT, a permission voltage is high in case of a current lower than the rating current of IGBT and the permission voltage decreases as the current becomes larger. Therefore, in this conventional example, at least two of clamp devices are connected in series between the collector and the gate in the IGBT. Switches are provided in parallel to the clam devices other than one clamp device. A switch control unit controls the switches based on a collector current detected by a detecting section. When the collector current of IGBT is as small as the rating current, the switches are opened such that all the clamp devices are connected between the collector and the gate of the IGBT. Thus, the clamp voltage of the IGBT is increased.

A load drive circuit which has a serge protection function is disclosed in Japanese Laid Open Patent Application (JP-A-Heisei 9-298834). In this conventional example, the load drive circuit has a serge protection function and is composed of an output transistor in which an emitter is grounded through a load and a collector is connected with a power supply line, and a control circuit section which controls a gate voltage of the output transistor to carry out an ON/OFF control of the output transistor. A serge detecting circuit section detects a power supply serge voltage on the power supply line. A drive circuit section supplies a voltage to the gate of the output transistor from the power supply line based on an output voltage of the serge detecting circuit section when the power supply serge voltage is detected such that the output transistor is turned on.

Also, a semiconductor integrated circuit is disclosed in Japanese Laid Open Patent Application (JP-A-Heisei 11-32429). In the semiconductor integrated circuit of this conventional example, a transistor is connected with an output terminal to drives a load. A transistor control circuit controls the transistor. An overvoltage protection section sets to a conductive state when a voltage between the gate of the transistor and the output terminal is higher than a predetermined voltage, and is contained in a clamp circuit. A clamp control circuit detects a change of a control signal of the transistor control circuit and controls the operation of the clamping circuit based on the detection result.

Also, a voltage clamping circuit is disclosed in Japanese Laid Open Patent Application (JP-A-Heisei 11-41801). In this conventional example, the voltage clamping circuit is composed of a power supply, a 3-terminal constant voltage device that two of three terminals are connected between the output terminals of this power supply, and a clamping circuit connected with first or third terminals of the 3-terminal constant voltage device. In the clamping circuit, a first transistor and a first resistance are connected in serial between the first and second terminals. A second resistance is connected between a node between the first transistor and the first resistance and the gate or base of the said first transistor. A third resistance is connected between the gate or base of the first transistor and the third terminal. A control circuit is connected in parallel to a series connection of the second resistance and the third resistance.

Also, a protection device of a semiconductor device is disclosed in Japanese Laid Open Patent Application (JP-P2000-245137A). In this conventional example, a voltage clamping circuit is connected between electrodes of the semiconductor device to clamp a voltage of the semiconductor device to a rating voltage when a current of the semiconductor device is blocked off. One end of the voltage clamping circuit is connected with an output electrode of the semiconductor device directly or with a conductive cooling body coupled to the electrode through a low inductance material at the most short distance, and the other end of the voltage clamping circuit is connected with the control electrode of the semiconductor device at the most short distance.

Also, a clamping circuit is disclosed in Japanese Laid Open Patent Application (JP-P2002-151989A). In this conventional example, the clamping circuit clamps a serge voltage to protect a switching element. A clamp section clamps an input voltage when the input voltage becomes higher than a specific value. A time setting section sets the clamp section to a non-operating state when a specific time passed after the clamp section starts the clamp.

Also, a vertical-type field effect transistor is disclosed in Japanese Laid Open Patent Application (JP-P2002-343969A). In This conventional example, the field effect transistor is composed of a semiconductor substrate of a first conductive type, and a first base region of a second conductive type formed on the semiconductor substrate to have a polygon shape. A second base region of the second conductive type is formed in the first base region, has a higher concentration than the first base region and contains a plurality of diagonal sections extending from the center of the first base region to each of the top sections of the polygon. A source region of the first conductive type is shallower than the second base region and formed to be divided by the plurality of diagonal sections in the second base region. A source electrode contacts the source region. A drain electrode contacts a back surface of the semiconductor substrate and opposes the first base region through a drain region of the semiconductor substrate. The edge section of the source electrode extends to the inside of the second base region beyond the bottom of the source region.

SUMMARY OF THE INVENTION

An object of the present invention is to provide an overvoltage protection circuit for preventing the destruction of an output MOS transistor.

In an aspect of the present invention, an overvoltage protection circuit is for a circuit of an output MOS transistor and a load connected in series between a first power supply and a second power supply. The overvoltage protection circuit contains a control signal circuit, a dynamic clamping circuit, a control switch, and a serge detecting circuit. The control signal circuit is connected between a gate of said output MOS transistor and said load, and the dynamic clamping circuit is connected with said gate of said output MOS transistor. The control switch is connected between said first power supply and said dynamic clamping circuit and the serge detecting circuit which monitors a voltage of said first power supply and turns on said control switch when the voltage of said first power supply increases to a voltage higher than a predetermined voltage.

In another aspect, the present invention relates to a method of protecting an output MOS transistor, wherein the output MOS transistor and a load are connected in series between a first power supply and a second power supply, and a series circuit of a control switch and a dynamic clamping circuit is connected between the first power supply and a gate of the output MOS transistor. The method is achieved by monitoring a voltage of said first power supply; and by turning off a control switch when the voltage of said first power supply increases to a voltage higher than a predetermined voltage.

DESCRIPTION OF THE PREFERRED EMBODIMENTS

Figure 1:
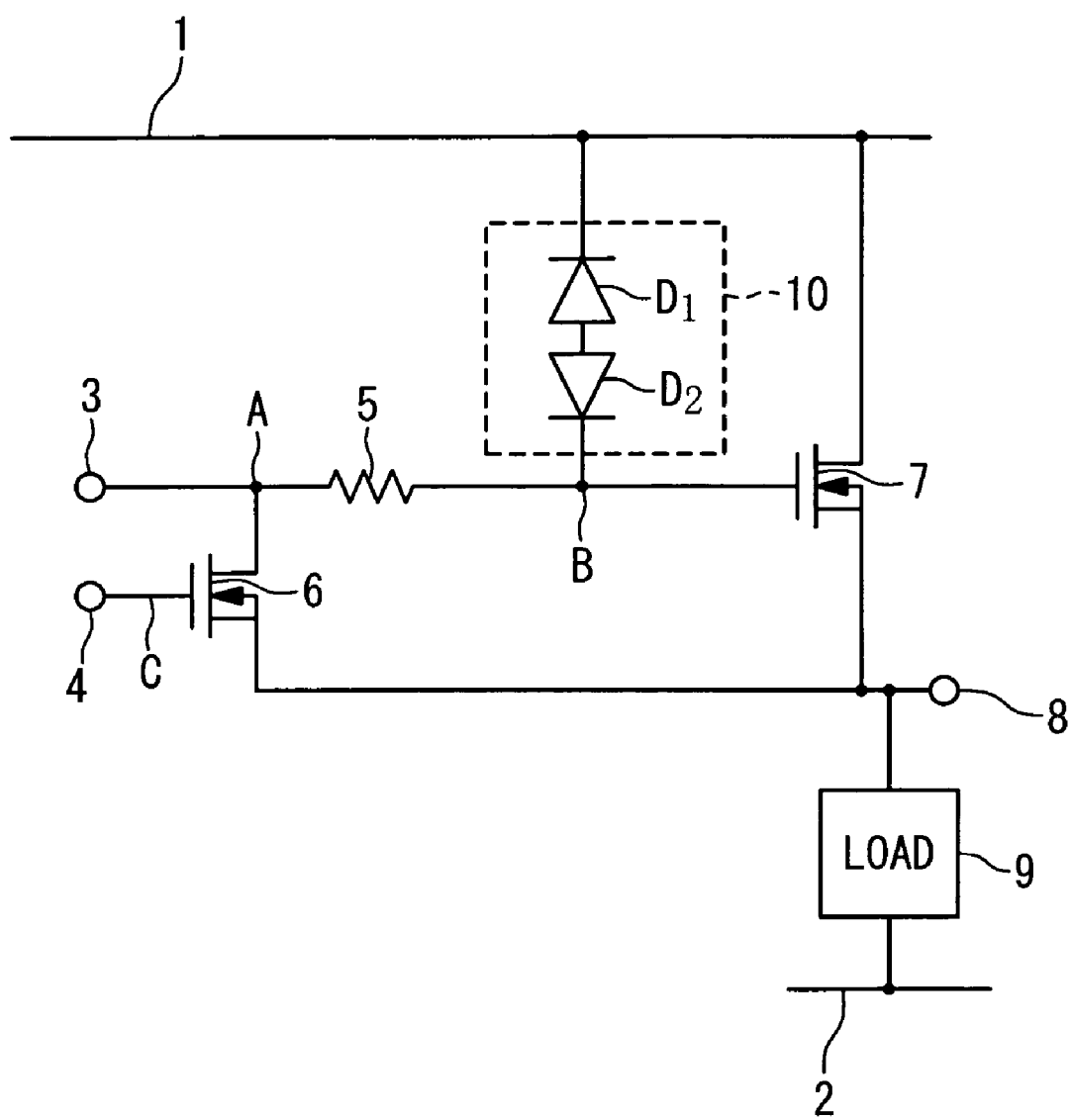
FIG. 1 is a circuit diagram showing a conventional example of an overvoltage protection circuit.
Figure 2:
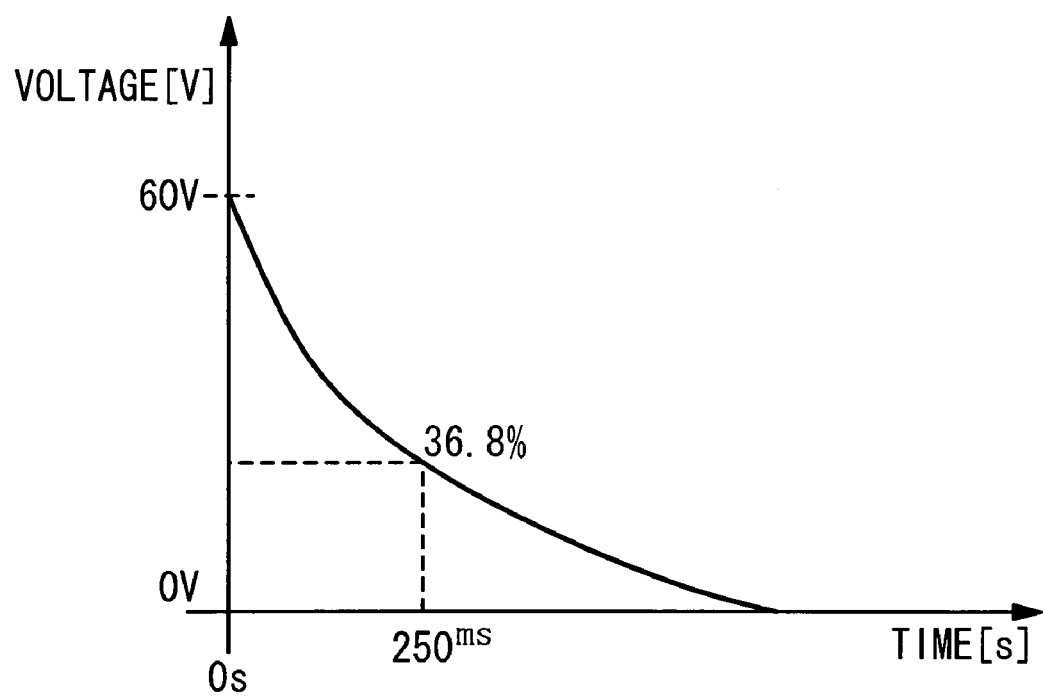
FIG. 2 is a diagram showing an application waveform of a dump serge.
Figure 3:
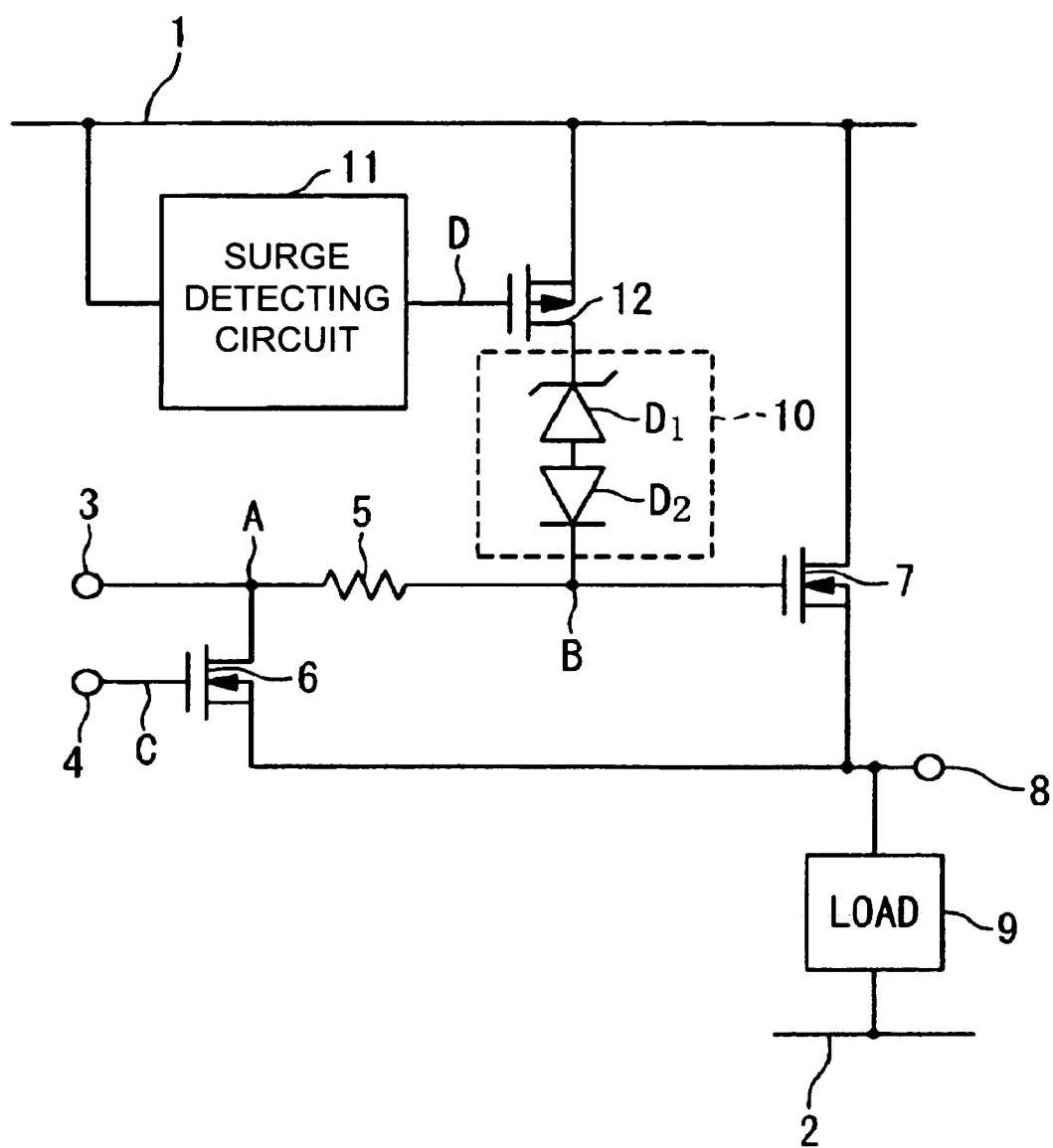
FIG. 3 is a circuit diagram showing an overvoltage protection circuit according to a first embodiment of the present invention.

Hereinafter, an overvoltage protection circuit of the present invention will be described in detail with reference to the attached drawings. Referring to FIG. 3, the overvoltage protection circuit according to the first embodiment of the present invention has an N-channel source follower structure in which an output MOS transistor 7 and a load 9 are connected in series between a first power supply 1 and a second power supply 2. A node between the output MOS transistor 7 and the load 9 is connected with an output terminal 8. The output MOS transistor 7 is controlled to the ON/OFF in response to a first control signal 3 supplied to a node A which is connected with the gate terminal, i.e. a node B through the gate resistance 5. The first control signal 3 is a voltage signal outputted from the boosting circuit (not shown), and takes a voltage level larger than a voltage of the first power supply 1 when the output MOS transistor 7 is turned on, and takes substantially the same voltage as a voltage of the second power supply 2 when the output MOS transistor 7 is turned off.

A MOS transistor 6 is connected between the node A and the output terminal 8 to discharge the gate charge of the output MOS transistor 7 when the output MOS transistor 7 is turned off. The MOS transistor 6 is controlled to the ON/OFF in response to a second control signal 4 supplied to the gate terminal, i.e., the node C. The second control signal 4 takes substantially the same voltage as the voltage of the first power supply 1 when the output MOS transistor 7 is turned on and takes substantially the same voltage as the voltage of the second power supply 2 when the output MOS transistor 7 is turned off.

The relation of the first control signal 3 and the second control signal is opposite, i.e., when the first control signal 3 is in a high level, the second control signal 4 is in a low level (the inverse is true, too). A MOS transistor as a control switch 12 and a dynamic clamping circuit 10 are connected in series between the first power supply 1 and the node B. The dynamic clamping circuit 10 is composed of a zener diode D1 and a diode D2 which are connected in series. The gate terminal of the control switch 12, i.e., the node D is connected with an output terminal of a serge detecting circuit 11. The serge detecting circuit 11 monitors the voltage of the first power supply 1 to detect a serge voltage of the first power supply 1 and outputs a detection signal to the node D to control the ON/OFF of the control switch 12.

Next, an operation of the overvoltage protection circuit when the output MOS transistor 7 is turned off will be described. In case of the turning-off operation of the output MOS transistor 7, the first control signal 3 is set to the low level, and the second control signal 4 is set to the high level. At this time, the MOS transistor 6 is turned on and the gate charge of the output MOS transistor (the charge of the node B) is discharged to the second power supply 2 through the output terminal 8 and the load 9. At this time, a negative output voltage is generated due to back electromotive force at the output terminal 8 because of an inductance component of the load (an inductance component of the load such as a solenoid and a wire harness). With the negative output voltage, the serge detecting circuit 11, i.e. the node D outputs the detection signal of the low level so that the dynamic clamping circuit 10 is in an operation possible state, like the conventional circuit. When a voltage between the power supply 1 and the output terminal 8 is larger than a breakdown voltage of the dynamic clamping circuit 10, the dynamic clamping circuit 10 breaks down so that a voltage between the drain and the source in the output MOS transistor 7 is clamped to the breakdown voltage of the dynamic clamping circuit 10, because the MOS transistor 6 is turned on. With the negative output voltage, the design of the load is carried out such that the current flowing through the output MOS transistor 7 does not cross over a safe operation area when the overvoltage protection circuit operates. Therefore, there is no case that the output MOS transistor 7 is destroyed.

On the other hand, the following operation different from the conventional example is carried out in a positive dump serge. The dump serge is generated on the first power supply 1 when a battery terminal is unfastened during the power generation by an alternator (not shown). If the dump serge is applied when the output MOS transistor 7 is in the off state, the serge detecting circuit 11 monitors and detects the serge voltage and outputs the detection signal of the high level to the node D. Therefore, the control switch 12 is turned off, so that the dynamic clamping circuit 10 does not operate. Thus, the output MOS transistor 7 is never set to the forward SOA mode. Also, because the voltage value of breakdown voltage of the output MOS transistor 7 is set to a value higher than the dump serge, the output MOS transistor 7 never breaks down.

Figure 4:
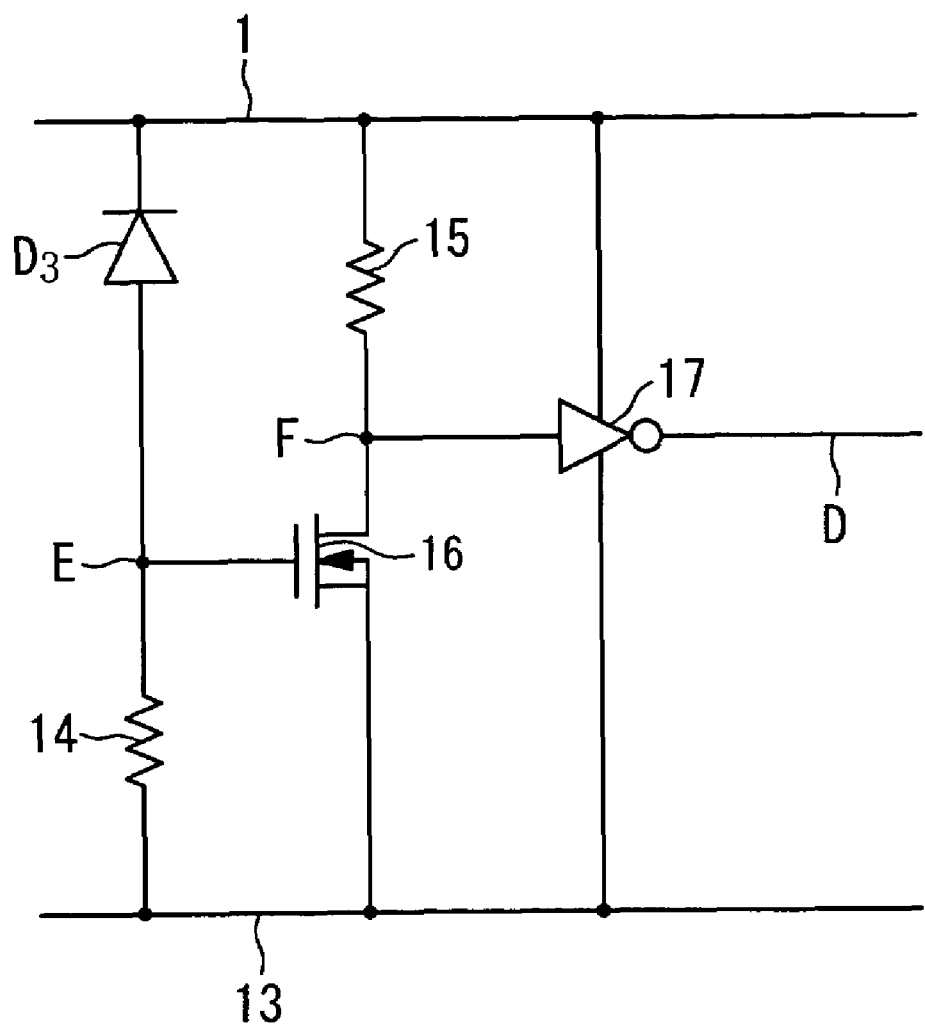
FIG. 4 is a circuit diagram showing a serge detecting circuit used in the first embodiment of the present invention.

FIG. 4 is a circuit diagram showing the serge detecting circuit 11. As shown in FIG. 4, the serge detecting circuit 11 is composed of a diode D3, a resistance 14, an inverter and an optional inverter 17. The diode D3 and the resistance 14 are connected in series between the first power supply 1 and a third power supply 13. The inverter is composed of an N-channel MOS transistor 16 and a resistance 15 connected in series between the first power supply 1 and the third power supply 13. The gate of the MOS transistor 16 is connected with a node E between the diode D3 and the resistance 14, and the drain of the MOS transistor 16 is connected with the first power supply 1 through the resistance 15. The inverter 17 is connected with a node F between the drain of the MOS transistor 16 and the resistance 15 and the output of the inverter 17 functions as a node D.

In the state that the dump serge is not applied, the node E is in a same low level as the third power supply 13. Therefore, the MOS transistor 16 is turned off so that the node F is in the high level, and the node D is in the low level. As a result, the control switch 12 is turned on. Thus, the dynamic clamping circuit 10 can operate to the output negative voltage.

On the other hand, when the dump serge is applied to the first power supply 1 and the serge voltage exceeds the breakdown voltage of the diode D3, the voltage of the node E becomes higher than the voltage of third power supply 13. Thus, the MOS transistor 16 is turned on so that the node F goes to the low level, and the node D goes to the high level. At this time, because the control switch 12 is turned off, the dynamic clamping circuit 10 does not operate to the dump serge.

In the present invention, the existence or non-existence of the dump serge is detected by the serge detecting circuit. The control switch 12 connected with the dynamic clamping circuit 10 is turned on or off in response to this detection signal from the serge detecting circuit 11. When the dump serge is detected, the serge detecting circuit 11 outputs the detection signal to turn off the control switch 12. Thus, because the dynamic clamping circuit 10 does not operate in application of the dump serge, the output MOS transistor 7 is never set to the forward SOA mode. Also, because the breakdown voltage of the output MOS transistor 7 is higher than the voltage value of the dump serge, the output MOS transistor 7 does not break down. Therefore, the current never flows through the output MOS transistor 7, and the output MOS transistor never starts heat destruction due to the dump serge.

With the negative output voltage is generated at the output terminal 8, the serge detecting circuit 11 does not operate at all. Therefore, the dynamic clamping circuit 10 is in the state that it can operate. When the negative output voltage generated at the output terminal 8 becomes larger than a breakdown voltage of the zener diode of the dynamic clamping circuit 10, the dynamic clamping circuit 10 operates carries out the overvoltage protection, like the conventional example.

What is claimed is:

1. An overvoltage protection circuit for a circuit of an output MOS transistor and a load connected in series between a first power supply and a second power supply, comprising:
    a drain and source of said output MOS transistor connected to said first power supply and load respectively;
    a dynamic clamping circuit connected with a gate of said output MOS transistor;
    a control switch connected between said first power supply and said dynamic clamping circuit; and
    a surge detecting circuit configured to monitor voltage of said first power supply and turn off said control switch such that said dynamic clamping circuit does not operate when the voltage of said first power supply increases to a voltage higher than a predetermined voltage, and
    wherein said first power supply has a positive potential relative to said second power supply, said output MOS transistor connected to said first power supply and said load connected to said second power supply.

2. The overvoltage protection circuit according to claim 1, further comprising:
    a control signal circuit connected between the gate of said output MOS transistor and said load.

3. The overvoltage protection circuit according to claim 2, wherein said control signal circuit comprises:
    a first resistance connected at a first end with said gate of said output MOS transistor, a second end of said first resistance being supplied a first control signal; and
    a discharge switch connected between said second end of said first resistance and a node between said output MOS transistor and said load,
    said output MOS transistor is turned on in response to said first control signal of a first logic level, and is turned off in response to said first control signal of a second logic level,
    said discharge switch is turned on when said output MOS transistor is turned off, such that a charge of said gate of said output MOS transistor is discharged through said first resistance, and said discharge switch is turned off when said output MOS transistor is turned on.

4. The overvoltage protection circuit according to claim 1, wherein said surge detecting circuit comprises:
    a first diode which has a cathode connected with said first power supply and breaks down when the voltage of said first power supply increases to the voltage higher than the predetermined voltage;
    a second resistance connected between an anode of said first diode and a third power supply;
    a first inverter which inverts a logic level corresponding to a voltage at a node between said first diode and said second resistance; and
    a second inverter which inverts an output of said first inverter such that said control switch is turned off when said first diode is broken down.

5. The overvoltage protection circuit according to claim 1, wherein said dynamic clamping circuit comprises:
    a zener diode which has a cathode connected with said first power supply; and
    a diode connected between an anode of said zener diode and said gate of said output MOS transistor.

6. The overvoltage protection circuit according to claim 1, wherein said output MOS transistor is formed by connecting a plurality of unit cell transistors in parallel, and has a second breakdown characteristic in a safe operation area.

7. A method of protecting an output MOS transistor, wherein said output MOS transistor and a load are connected in series between a first power supply and a second power supply, a drain and source of said output MOS transistor connected to said first power supply and load respectively, and a series circuit of a control switch and a dynamic clamping circuit is connected between said first power supply and a gate of said output MOS transistor, said method comprising:
    monitoring voltage of said first power supply; and,
    wherein said first power supply has a positive potential relative to said second power supply, said output MOS transistor connected to said first power supply and said load connected to said second power supply.

8. The method according to claim 7, wherein said load is an inductive load, said method further comprises:

disconnecting said gate of said output MOS transistor from a drain of said output MOS transistor when said output MOS transistor is turned on; and connecting said gate of said output MOS transistor and said drain of said output MOS transistor through a resistance when said output MOS transistor is turned off, such that a charge of said gate of said output MOS transistor is discharged through said resistance.

9. The overvoltage protection circuit according to claim 7, wherein said monitoring comprises:

setting a voltage of a first node to a high voltage when the voltage of said first power supply does not increase to the voltage higher than the predetermined voltage; and setting a voltage of the first node to a low voltage when the voltage of said first power supply increases to the voltage higher than the predetermined voltage, said turning off a control switch comprises:

turning off said control switch based on the low voltage of the first node.

* * * * *